United States Patent [19]

Blomquist

[11] Patent Number: 5,367,433

[45] Date of Patent: Nov. 22, 1994

[54] PACKAGE CLIP ON HEAT SINK

[76] Inventor: Michael L. Blomquist, 3474 Carl Ct., Newbury Park, Calif. 91320

[21] Appl. No.: 127,332

[22] Filed: Sep. 27, 1993

[51] Int. Cl.⁵ .............................................. H05K 7/20
[52] U.S. Cl. .................................... 361/704; 165/80.3; 165/185; 174/16.3; 257/712; 257/718; 361/710; 361/718
[58] Field of Search .............................. 165/80.3, 185; 174/16.3; 257/707, 712, 713, 718–719, 726–727; 361/690, 702, 704, 707–722; 439/487

[56] References Cited

U.S. PATENT DOCUMENTS

| | | | |
|---|---|---|---|
| 4,679,118 | 7/1987 | Johnson et al. | 361/718 |
| 5,241,453 | 8/1993 | Bright et al. | 361/704 |
| 5,276,585 | 1/1994 | Smithers | 361/709 |
| 5,295,043 | 3/1994 | Beijer | 361/704 |

FOREIGN PATENT DOCUMENTS

| | | | |
|---|---|---|---|
| 2425723 | 12/1975 | Germany | 174/16.3 |
| 3423725 | 1/1986 | Germany | 257/718 |
| 266225 | 3/1989 | Germany | 361/718 |

Primary Examiner—Gregory D. Thompson
Attorney, Agent, or Firm—Bruce A. Jagger

[57] ABSTRACT

A heat sink-spring clip assembly for mounting on a PQFP electronic package wherein leaf spring legs engage with the outermost diametrically opposed ends of the bumpers on the PQFP, and the assembly is positioned relative to the PQFP package by means of tabs which extend normally downwardly to engage the upper sides of the PQFP well above and out of contact with the electrical leads.

12 Claims, 3 Drawing Sheets

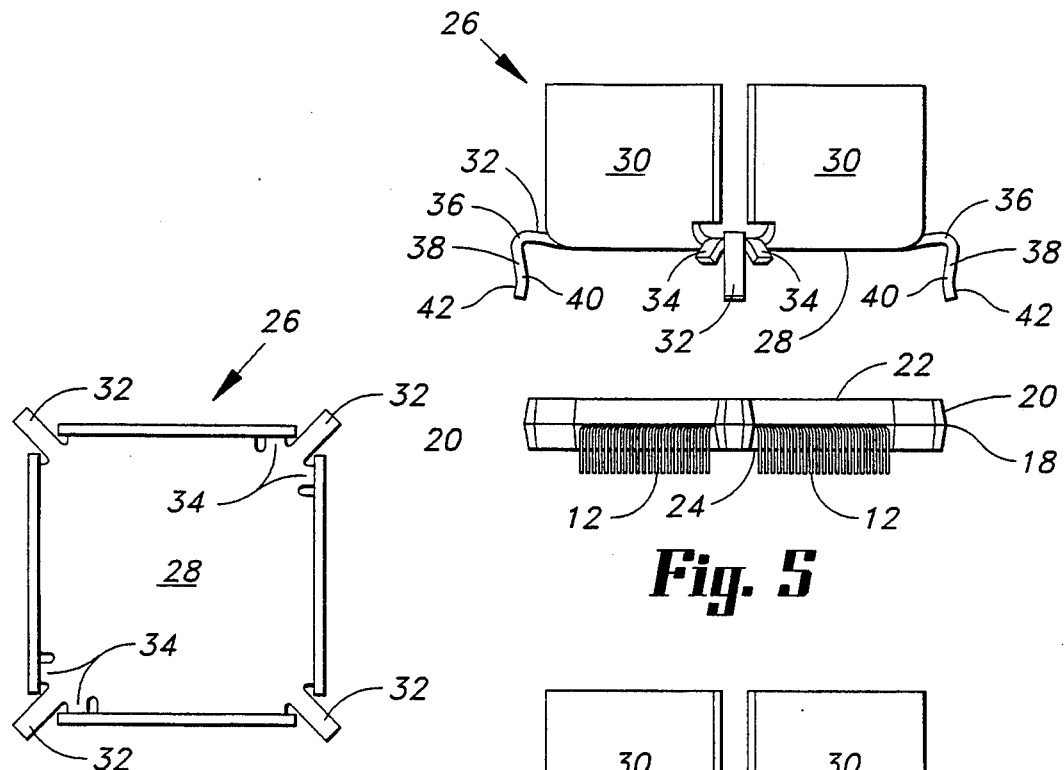
Fig. 5
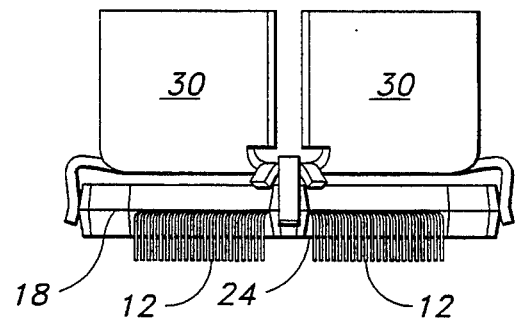
Fig. 3
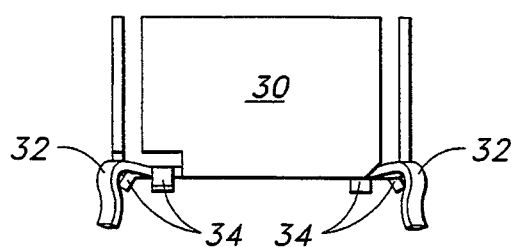
Fig. 6
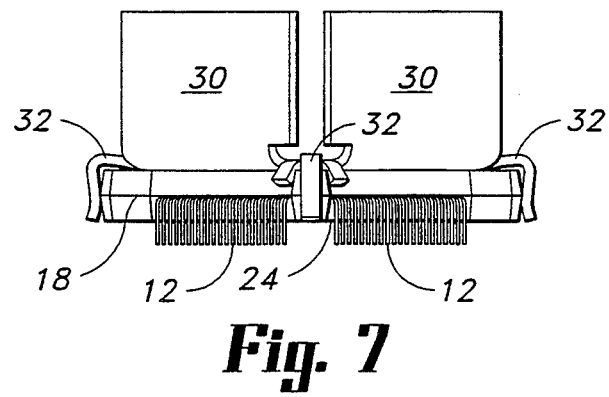
Fig. 4
Fig. 7

PACKAGE CLIP ON HEAT SINK

BACKGROUND OF THE INVENTION

1. Field of the Invention

The invention relates in general to clip on heat sink assemblies, and, in particular to clip on heat sink assemblies for conventional electronic packages with side projecting leads and outwardly projecting bumpers or ears to protect those leads.

2. Description of the Prior Art

Electronic devices generate heat when operated. That heat must be dissipated in some way or the electronic device will be ruined. The electronic devices, particularly chips, are often mounted in electronic packages. One form of such an electronic package which is generally used is described as a plastic quad flat pack (PQFP). A PQFP electronic package is a generally flat container in which a chip is mounted. Leads extend outwardly from the sides of the package at a location approximately midway between the upper and lower surfaces of the PQFP. These leads are small and quite easily bent, so they are protected from damage by bumpers or ears which extend outwardly from the corners of the package.

Heat is often dissipated from electronic devices by mounting finned heat radiators in heat conducting relationship with the exposed surfaces of the devices. Such heat radiators need to be firmly mounted to the electronic device or package so that heat flows by conduction from the device to the radiator. Also, the radiator must be secured so that it does not fall into contact with surrounding leads and electronic devices.

Heat radiators are generally mounted to electronic devices and packages in one of two ways. A heat-conductive adhesive may be used which, when cured, bonds the radiator more or less permanently to the package or device. Alternatively, and preferably, a spring clip such as that shown, for example, in Blomquist, U.S. Pat. No. 5,208,731 patented May 4, 1983, is used to clip the heat sink to the electronic device. Such clip mounted heat sinks or radiators are quickly and easily applied and removed. Spring clips generally extend normally downwardly along the side of the electronic device or package and engage with either the bottom of the device or the base in which it is mounted. Where conductive leads extend out of the side of a package as in the PQFP design, it is not possible to extend spring clips down along the side of the package. It had previously been generally believed that, despite its drawbacks, the only way to mount a heat sink on a PQFP electronic package was by means of adhesive. Spring clips, it was generally believed, would short out the leads.

These and other difficulties of the prior art have been overcome according to the present invention.

BRIEF SUMMARY OF THE INVENTION

A preferred embodiment of the clip on heat sink assembly according to the present invention comprises a spring clip assembly in which the leaf spring legs extend downwardly in resilient engagement with the outer ends of the diametrically opposed bumpers or ears on the PQFP electronic package. The leaf spring legs are not long enough to reach downwardly for the full thickness of the PQFP electronic package so there is no risk of their coming into engagement with the underlying printed circuit board.

The positions of the leaf spring legs relative to the outer ends of the bumpers are stabilized by means of very short tabs which extend normally downwardly immediately adjacent to and on either side of at least two of the leaf spring legs. The tabs extend far enough to engage with the upper side edges of the electronic package above the location where the leads extend from the sides of the package. The tabs are long enough to prevent lateral movement of the leaf spring legs when they are fully engaged.

In a preferred embodiment, the clip and heat sink are integral, being formed from a single sheet of metal. Alternatively, the clip and heat sink may be separate entities. Preferably, the leaf spring legs and locating tabs are integral; however, they may be on separate elements which are suitably secured to one another.

BRIEF DESCRIPTION OF THE DRAWINGS

Referring particularly to the drawings for the purposes of illustration and not limitation:

FIG. 3 is a plan view of a fully formed integral heat sink and clip.

FIG. 4 is a side elevation of the embodiment of FIG. 3.

FIG. 5 is an exploded side elevation similar to FIG. 1.

FIG. 6 is a side elevation similar to FIG. 5 showing the integral clip and heat sink assembly partially installed on a PQFP electronic package.

FIG. 7 is a view similar to FIG. 6 showing the integral clip and heat sink fully installed on a PQFP electronic package.

DETAILED DESCRIPTION OF THE PREFERRED EMBODIMENTS

Figure 1:
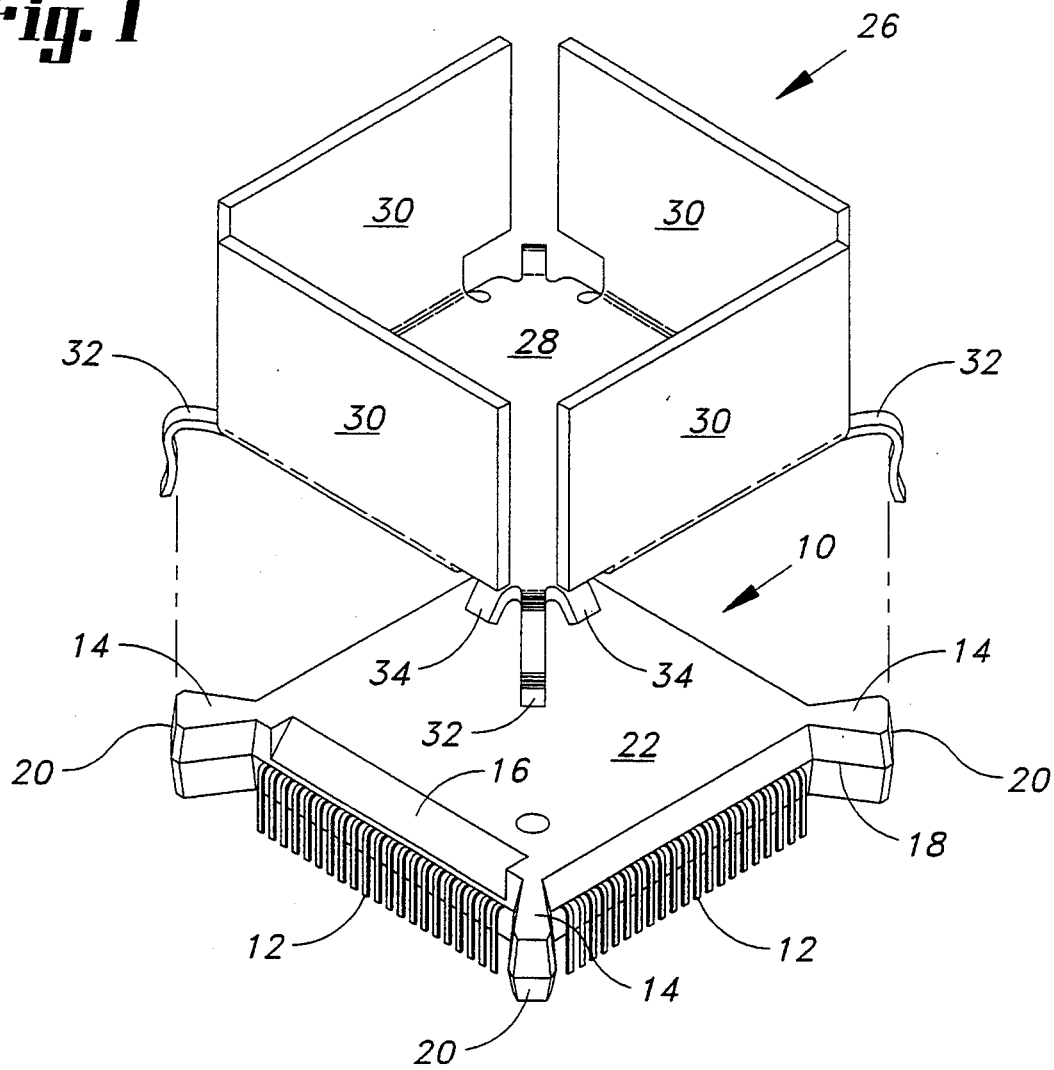
FIG. 1 is an exploded perspective view of a preferred embodiment of the invention.

Referring particularly to the drawings, there is illustrated generally at 10 a conventional plastic quad flap pack (PQFP) having electrical leads 12 emanating from approximately the midpoint of the thickness of the respective sides of PQFP 10. Bumpers or ears 14 project diametrically outwardly from the corners of PQFP 10 so as to protect leads 12. Leads 12 project from each of the four sides of the rectangular PQFP 10. One side of PQFP 10 is slightly different from the others in that it is provided with ramp 16. Ramp 16 serves to orient the otherwise symmetrical PQFP 10 for purposes of automated handling and visual inspection. Immediately adjacent the base of bumpers 14, the side which includes ramp 16 has the same configuration as the other three sides of PQFP 10.

PQFP 10 is generally molded from some nonconductive material such as plastic or ceramic. In order to facilitate the molding process, it is provided with a parting line 18 which extends around the perimeter of the sides and bumpers of PQFP 10. The leads extend from approximately this parting line in the midportions of the four respective sides of PQFP 10. By reason of this enlargement at parting line 18, the outermost ends 20 of bumpers 14 generally form ramps that extend from the normally upper surface 22 of PQFP 10 to the parting line 18 and then a second ramp tapers generally inwardly from parting line 18 to normally lower surface 24. As will be seen shortly, the present invention takes advantage of the enlargement of the outermost ends 20 at parting line 18.

A combined heat sink and clip is indicated generally at 26. Panel 28 has a generally rectangular planform which is adapted to be positioned in and substantially co-extensive with generally planar normally upper surface 22. Panel 28 is a generally planar heat conductive body which, in the embodiment of FIGS. 1 through 7, serves a plurality of functions.

Panel 28 serves to receive heat from the normally upper surface 22 of PQFP 10 by reason of its physical contact with planar surface 22. Panel 28 serves as a heat sink, a heat radiator and a heat conductor. A portion of the heat which flows from surface 22 into panel 28 flows through panel 28 and into radiating panels 30 from where it is dissipated into the surrounding environment.

In addition to its heat transfer functions, panel 28 is integral with and serves to mount leaf spring legs 32 and positioning or locating tabs 34. Panel 28 provides sufficient structural strength to maintain the respective leaf spring legs 32 and positioning tabs 34 in their desired predetermined positions.

Leaf spring legs 32 include, particularly as shown, for example, in FIG. 5, spring loop portion 36, reentrant portion 38, detent portion 40 and relief portion 42. The assembly of the combined heat sink and spring clip 26 onto PQFP 10 may be conveniently observed by following the sequence of steps in the installation of heat sink and clip 26 onto PQFP 10. As illustrated, for example, in FIGS. 5 through 7, as relief portions 42 of leaf spring legs 32 move normally downwardly along the normally upper ramps which are defined by the outermost ends 20 of bumpers 14 towards parting line 18, the relief provided by relief portion 42 prevents the leaf spring legs 32 from digging into the outermost ends 20. The leaf spring legs 32 thus slide smoothly along the diametrically opposed outer ends 20 of bumpers 14 towards parting line 18. As the relief portions 42 are forced diametrically outwardly from one another by the effects of the ramps, the spring loop portions 36 resiliently bias detent portions 40 into engagement with outermost ends 20. As detent portions 40 move normally downwardly past parting line 18, the spring bias provided by spring loop portions 36 drives detent portions 40 towards one another. In the fully assembled configuration shown, for example, in FIG. 7, the detent portions 40 are engaged with outermost ends 20 on the remote side of parting line 18 from normally upper surface 22. Thus, the spring bias in spring loop portions 36 retains the combined heat sink in clip 27 in assembled configuration with PQFP 10. The legs 32 are not long enough to reach any underlying circuit board.

Positioning tabs 34 are positioned closely adjacent to leaf spring legs 32 on opposite sides thereof so as to engage the sides of PQFP 10 immediately adjacent to the roots of diametrically opposed bumpers 14. Tabs 34 are not long enough to reach leads 12, so there is no risk of shorting out the electrical device which is contained in PQFP 10. In the preferred embodiment illustrated, there are two sets of positioning tabs 34 located on diametrically opposed corners of panel 28. Other arrangements can be employed if desired.

In FIGS. 8 through 13, various embodiments are illustrated in which the heat sink-dissipater and spring clip are manufactured as separate components. Heat sink-dissipater 44 has a generally rectangular planform which is generally co-extensive with that of the PQFP 10. Heat dissipating pins or fins 46 project outwardly from the normally upper surface of heat sink-dissipater 44 so as to dissipate the heat which is received by conduction from the normally upper surface 22 of PQFP 10. A diametrically extending groove 48 is cut across the upper surface of heat sink-dissipater 44 from one corner to the diagonally opposite corner. Groove 48 is adapted to receive in a snug fit the body of spring clip 50. Spring legs 52 extend diametrically beyond heat sink-dissipater 44 so as to engage the outermost ends 20 of bumpers 14 on PQFP 10. Spring legs 52 are shaped similarly to leaf spring legs 32 with a spring loop portion, a reentrant portion, a detent portion and a relief portion. Locator tabs 54 serve to extend downwardly along the sides of heat sink-dissipator 44 and into engagement with the upper sides of PQFP 10 above and out of contact with leads 12. Locating tabs 54 thus serve to position and hold both the heat sink-dissipator 44 and the spring clip 50 in operative position relative to PQFP 10.

Figure 11:
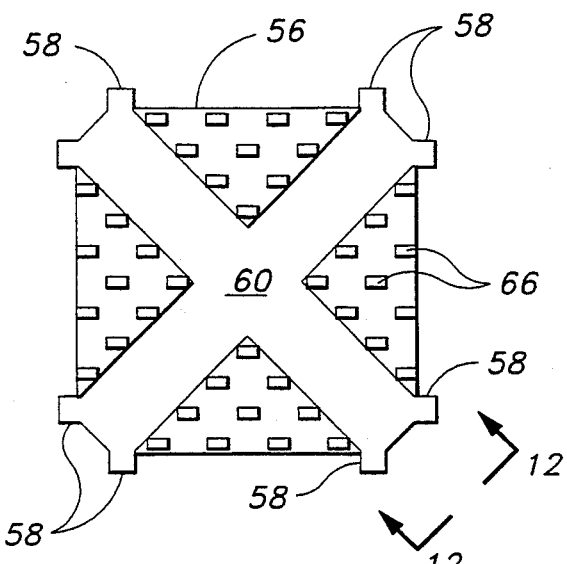
FIG. 11 is a plan view of a further embodiment in which positioning or locating tabs are located on the heat sink member.
Figure 13:
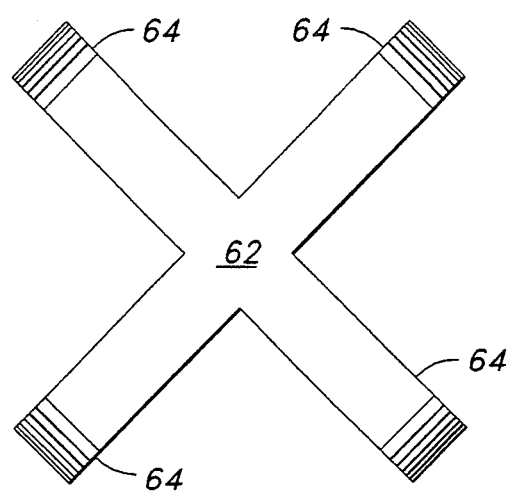
FIG. 13 is a plan view of a cruciform spring clip which is adapted for use with the heat sink of FIG. 11.
Figure 9:
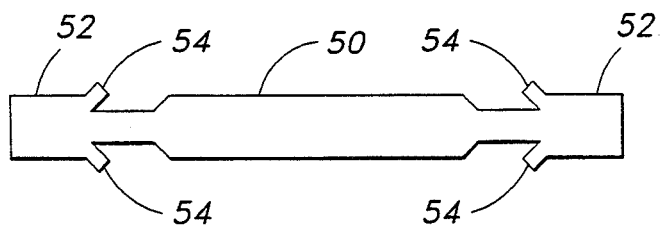
FIG. 9 is a plan view of a spring clip for use with the embodiment of FIG. 8.
Figure 10:
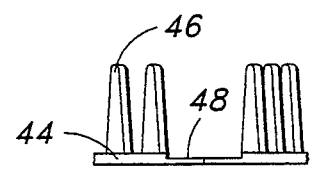
FIG. 10 is a fragmentary view taken along line 10—10 in FIG. 8.
Figure 8:
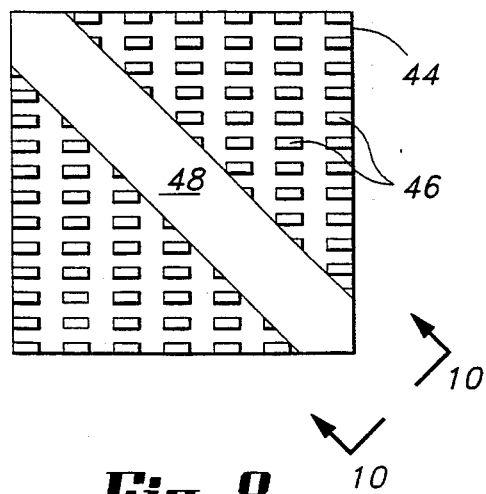
FIG. 8 is a plan view of an embodiment of a heat sink which is separate from the spring clip.
Figure 12:
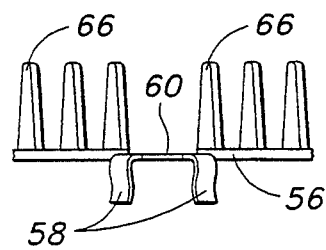
FIG. 12 is a fragmentary view taken along line 12—12 in FIG. 11.

In the embodiment illustrated, for example, in FIGS. 11 through 13, heat sink 56 includes tabs 58 and a cruciform-shaped groove 60. A cruciform-shaped spring clip 62 is adapted to be received snugly in cruciform groove 60. The diametrically opposed ends of cruciform-shaped spring clip 62 are formed into spring legs 64. Spring legs 64 have approximately the same configuration as leaf spring legs 32 with a spring loop portion, a reentrant portion, a detent portion, and a relief portion. Tabs 58 on heat sink 56 are positioned so as to extend normally downwardly into engagement with the upper sides of PQFP 10 above leads 12. Heat sink 56 has a generally rectangular planform which is generally co-extensive with normally upper surface 22 of PQFP 10. When heat sink 56 is in operative heat conductive relationship with PQFP 10, tabs 58 serve to hold these two components in proper operative relationship against lateral movement. Spring legs 64 of spring clip 62 engage the outermost ends 20 of bumpers 14 on PQFP 10 so as to hold heat sink 56 firmly against the normally upper surface 22 and prevent its being dislodged from this operative position. Heat dissipating pins 66 serve to dissipate the heat which the assembly received from PQFP 10.

Figure 2:
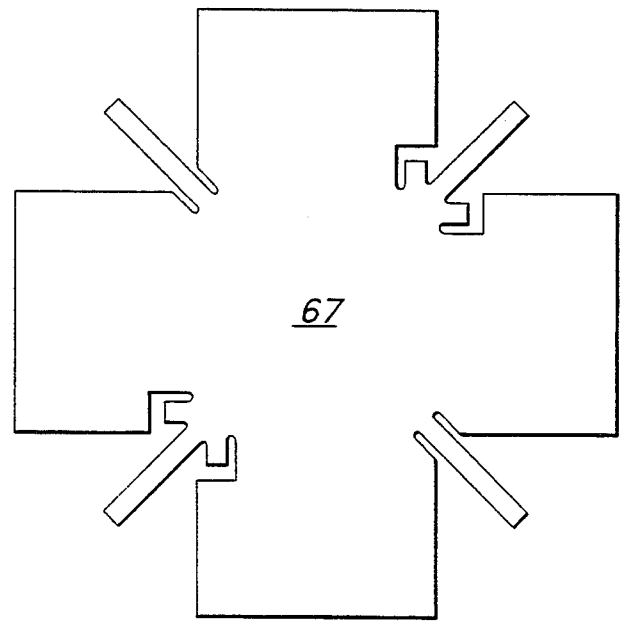
FIG. 2 is a plan view of an integral clip and heat sink at an intermediate stage in its formation.

As illustrated particularly in FIG. 2, one of the advantages of an integral spring clip and heat sink is that the whole device can be formed from a single sheet of metal by relatively simple stamping and bending operations. The blank 67 is still in its flat form which has been shaped by a single stamping operation. Where four radiating panels, as shown in FIG. 1, for example, are adequate to dissipate the heat, this is a preferred form of construction.

What has been described are preferred embodiments in which substitutions, reversals of parts, modifications and changes may be made without departing from the spirit and scope of the accompanying claims.

What is claimed is:

1. A clip on heat sink for an electronic package of the type having a generally rectangular planform, a generally planar normally upper surface, four sides, electrically conductive leads projecting from said sides at locations spaced from said upper surface, and ears projecting generally diametrically outwardly from four corners of said electronic package, said clip on heat sink comprising:
  a heat conductive body having a generally rectangular planform adapted to correspond approximately to the generally rectangular planform of said electronic package and adapted to being positioned in heat receiving contact with said generally planar normally upper surface; and
  a first clip unit at a first corner of said body including a leaf spring leg adapted to being biased into resilient engagement with the outer end of a first of said ears, a pair of tabs on either side of said leaf spring leg adapted to engage the sides of said electronic package adjacent said first ear.

2. A clip on heat sink of claim 1 including a second clip unit at a second corner of said body diametrically opposed to said first corner, said second clip on unit including a second leaf spring leg adapted to being biased into resilient engagement with the outer end of a second of said ears, a pair of tabs on either side of said second leaf spring leg adapted to engage the sides of said electronic package adjacent said second ear.

3. A clip on heat sink of claim 1 including third and fourth clip units at respective third and fourth corners of said body, said third and fourth corners being generally diametrically opposed to one another, each of said third and fourth clip units including a leaf spring leg adapted to being biased into resilient engagement with the outer ends of respective third and fourth ears.

4. A clip on heat sink of claim 1 including heat dissipating projections extending from said body.

5. A clip on heat sink of claim 1 wherein said body and first clip unit are integral.

6. A clip on heat sink for an electronic package of the type having a generally rectangular planform, a predetermined thickness, a generally planar normally upper surface, four sides, electrically conductive leads projecting from said sides at locations spaced from said generally planar normally upper surface, and ears projecting generally diametrically outwardly from four corners of said electronic package, said clip on heat sink comprising:
  a heat conductive body adapted to being positioned in heat receiving contact with said generally planar normally upper surface, said body including a first clip unit including a first leaf spring leg adapted to being biased into resilient engagement with the outer end of a first of said ears, a pair of tabs on either side of said leaf spring leg adapted to engage the sides of said electronic package adjacent said first ear, a second clip unit diametrically opposed to said first corner, said second clip unit including a second leaf spring leg adapted to being biased into resilient engagement with the outer end of a second of said ears, and a pair of tabs on either side of said second leaf spring leg adapted to engage the sides of said electronic package adjacent said second ear, third and fourth clip units generally diametrically opposed to one another, each of said third and fourth clip units including a leaf spring leg adapted to being biased into resilient engagement with the outer ends of respective third and fourth ears.

7. A clip on heat sink of claim 6 wherein the respective said leaf spring legs are adapted to being shorter than the thickness of said electronic package, and the respective said tabs are adapted to being shorter than the distance from said generally planar normally upper surface to said electrically conductive leads.

8. A clip on heat sink of claim 6 wherein said leaf spring legs are adapted to cooperate with projecting portions of the respective outer ends of said ears to retain slid heat sink in operative position with said electronic package.

9. A clip on heat sink for an electronic package of the type having a generally rectangular planform, a predetermined thickness, a generally planar normally upper surface, four sides, electrically conductive leads projecting from said sides at locations spaced from said generally planar normally upper surface, and ears projecting generally diametrically outwardly from four corners of said electronic package, said clip on heat sink comprising:
  a heat conductive body adapted to being positioned in heat receiving contact with said generally planar normally upper surface;
  a spring clip unit including a first leaf spring leg adapted to being biased into resilient engagement with the outer end of a first of said ears, a second leaf spring leg adapted to being biased into resilient engagement with the outer end of a second of said ears, said first and second ears being diametrically opposed to one another;
  a pair of tabs on either side of said first leaf spring leg adapted to engage the normally upper sides of said electronic package adjacent said first ear, and a pair of tabs on either side of said second leaf spring leg adapted to engage the normally upper sides of said electronic package adjacent said second ear, whereby said heat conductive body is adapted to being held securely in operative heat conductive position with said electronic package.

10. A clip on heat sink of claim 9 wherein said tabs are integral with said spring clip unit.

11. A clip on heat sink of claim 9 wherein said tabs are integral with said heat conductive body.

12. A clip on heat sink of claim 9 wherein said spring clip unit and heat conductive body are integral with one another.

* * * * *